(12) United States Patent
Ban

(10) Patent No.: US 7,123,362 B2
(45) Date of Patent: Oct. 17, 2006

(54) METHOD FOR ALIGNING WAFER

(75) Inventor: Keun Do Ban, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 137 days.

(21) Appl. No.: 10/998,816

(22) Filed: Nov. 30, 2004

(65) Prior Publication Data
US 2005/0185183 A1   Aug. 25, 2005

(30) Foreign Application Priority Data
Feb. 25, 2004   (KR) ...................... 10-2004-0012775

(51) Int. Cl.
*G01B 11/00* (2006.01)
(52) U.S. Cl. ...................................... 356/401; 356/400
(58) Field of Classification Search ........ 356/399–401, 356/614; 250/548; 430/5, 22, 30, 55, 77, 430/151, 382
See application file for complete search history.

(56) References Cited

U.S. PATENT DOCUMENTS

| | | | |
|---|---|---|---|
| 5,696,835 A * | 12/1997 | Hennessey et al. ......... | 382/141 |
| 6,481,003 B1 * | 11/2002 | Maeda ........................ | 716/21 |
| 2005/0009214 A1 * | 1/2005 | Lim et al. ..................... | 438/7 |

* cited by examiner

*Primary Examiner*—Layla G. Lauchman
(74) *Attorney, Agent, or Firm*—Heller Ehrman LLP

(57) ABSTRACT

A method for aligning wafer includes selecting a nun-defective wafer alignment mark of a first wafer loaded in an exposure apparatus, and storing non-defective wafer alignment marks as a gray level reference image. A plurality of wafer alignment marks of a loaded second wafer are stored. Each of the plurality of wafer alignment mark images of the second wafer are respectively compared with the reference image of the first wafer pixel by pixel to obtain matching value for each of the plurality of the wafer alignment mark images. Each of the plurality of values of the matching values are compared with a set minimum value. The wafer alignment mark image having the matching value smaller than the minimum value with the reference image is replaced. The alignment information for an underlying layer using a wafer alignment information for an underlying layer using a wafer alignment sensor is obtained.

6 Claims, 3 Drawing Sheets

METHOD FOR ALIGNING WAFER

BACKGROUND OF THE INVENTION

1. Field of the Invention

The present invention generally relates to a method for aligning wafer, and more specifically to a method for aligning wafer wherein a non-defective wafer alignment mark which is used as a reference image is compared to wafer alignment marks and a defective wafer alignment mark image is replaced with the reference image to obtain alignment information of an underlying layer, thereby improving the overlay accuracy for an underlying layer.

2. Description of the Related Art

In accordance with a conventional wafer alignment method, alignment information such as an offset, a wafer scale, orthogonality and wafer rotation to an underlying layer, are calculated from a plurality of arbitrary wafer alignment marks on each die of a wafer, i.e. from alignment marks selected from a job file by a wafer alignment sensor in an exposure process.

In accordance with the conventional method for aligning wafer, even when only one of the selected alignment marks has a defect, the overlay accuracy of a lithography process may be degraded severely. As a result, detection of alignment signal by the wafer alignment sensor was not possible.

In addition, as long as the calculated alignment information for the underlying layer, such as the offset, the wafer scale, the orthogonality and the wafer rotation does not exceed the limit set in the exposure apparatus, the measured wafer alignment value was not reflected n wafer alignment even though the value was sufficient to affect the alignment accuracy. As a result, the overlay accuracy was deteriorated.

SUMMARY OF THE INVENTION

Accordingly, it is an object of the present invention to provide a method for aligning wafer wherein non-defective wafer alignment marks are obtained using an image substitution method by image processing to improve the overlay accuracy for the underlying layer.

In order to achieve above-described object, there is provided a method for aligning wafer comprising the steps:

(a) loading and aligning a first wafer in an exposure apparatus;

(b) selecting a non-defective wafer alignment mark among a plurality of wafer alignment marks of the first wafer and storing the non-defective wafer alignment marks as a gray level reference image in a job file;

(c) loading a second wafer and storing a plurality of wafer alignment marks of the second wafer as gray level wafer alignment mark images;

(d) respectively comparing each of the plurality of wafer alignment mark images of the second wafer with the reference image of the first wafer pixel by pixel to obtain matching value for each of the plurality of the wafer alignment mark images;

(e) comparing each of the plurality of the matching values with a minimum value set in the exposure apparatus;

(f) replacing the wafer alignment mark image having the matching value smaller than the minimum value with the reference image; and (g) obtaining an alignment information for an underlying layer using a wafer alignment sensor.

DETAILED DESCRIPTION OF THE EXEMPLARY EMBODIMENTS

Figure 1:
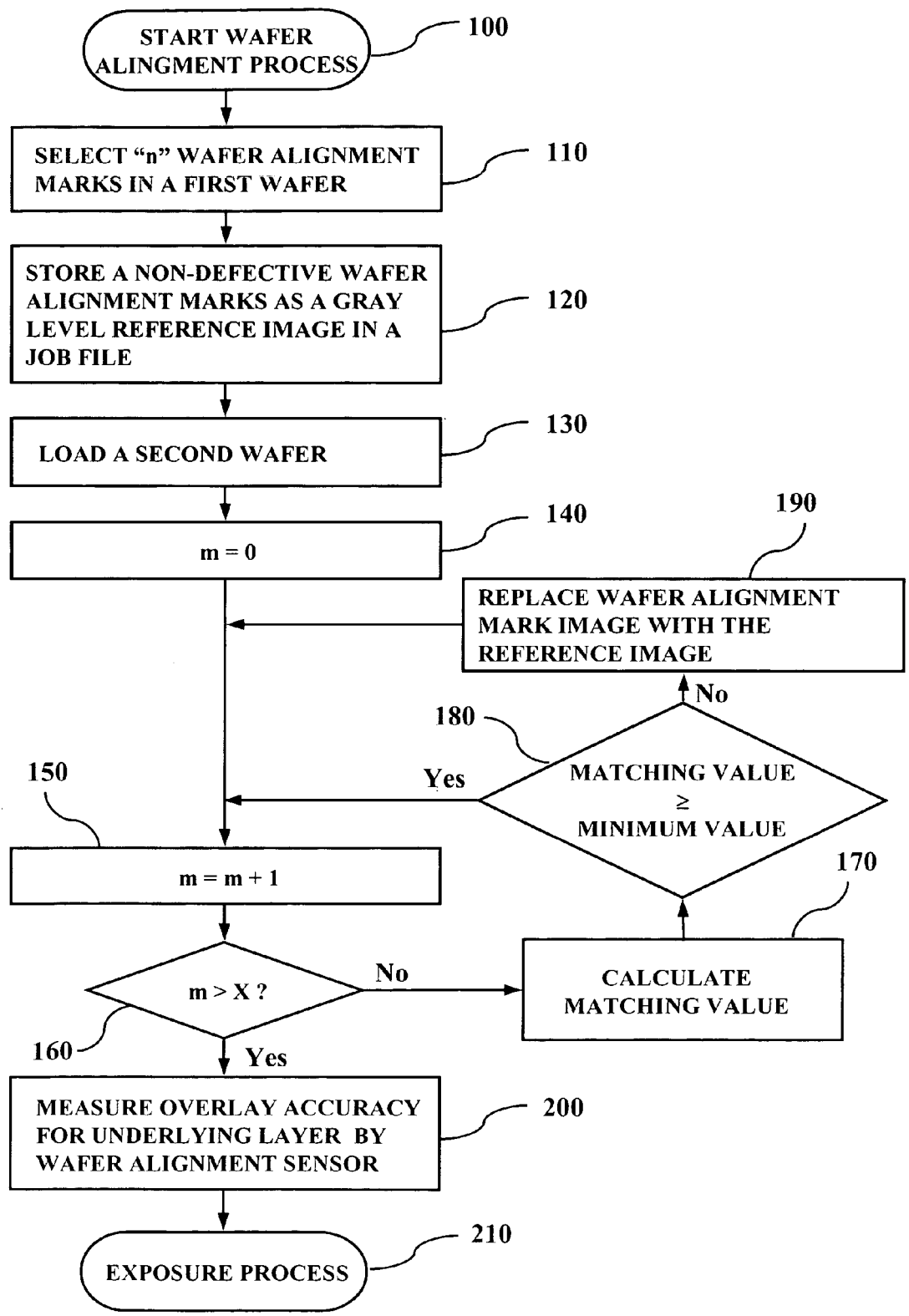
FIG. 1 is a flow chart illustrating a method for aligning wafer in accordance with the present invention.

A method for aligning wafer in accordance with an embodiment of the present invention will now be described in detail with reference to the accompanying drawings. Wherever possible, the same reference numerals will be used throughout the drawings to refer to the same or like parts.

FIG. 1 depicts an image-processing wafer alignment algorithm using a comparison and replacement method with a reference image.

Step 100 through step 210 will be described referring to FIG. 1.

[Step 100] and [Step 110]

The method for alignment of a wafer in accordance with the present invention starts at step 100 where a sample wafer is loaded and aligned in an exposure apparatus.

N wafer alignment marks in a job file are selected from the first wafer, where "n" is a natural number. Here, the selected alignment marks are chosen from the entire die in the wafer.

[Step 120]

A non-defective wafer alignment mark is selected among the selected wafer alignment marks of the first wafer. The selected non-defective wafer alignment mark is converted to and stored as a gray level reference image in the job file of the exposure apparatus. Here, the gray level reference image has 256 data level per pixel, i.e. 8 bit gray data level.

The gray level reference image may be shifted to coordinate (0,0) designated by the exposure apparatus when stored in the job file.

[Step 130]

A wafer to be aligned is loaded in the exposure apparatus as a second wafer. A plurality of wafer alignment marks of the second wafer are then stored in a job file as a plurality of gray level wafer alignment mark images.

[Step 140]

A value of M is initially set to zero, i.e. m=0. Here, "m" refers to the number of wafer alignment marks in the second wafer that will be compared with the reference image of the first wafer.

[Step 150]

The m is set to m+1, i.e. m is increased by 1.

[Step 160]

When m is greater than X where "X" is the total number of wafer alignment marks of the second wafer stored in the job file in the step 130, step 200 is performed. Otherwise, step 170 is performed.

[Step 170]

Each of the plurality of wafer alignment mark images of the second wafer is respectively compared to the reference image of the first wafer pixel by pixel. Specifically, each pixel of the reference image is compared to the corresponding pixel of the wafer alignment mark image of the second wafer in the same position to obtain matching value for each of the plurality of the wafer alignment mark images.

In addition, method for calculating the matching value will be described in detail with reference to FIGS. 2a through 2c in the corresponding section.

[Step 180]

Each of the plurality of the matching values with the minimum value is set in the exposure apparatus. When the matching value is the same as or greater than the minimum value, "YES" is selected and the step 150 is performed again. Otherwise, "NO" is selected and the step 190 is performed. When "NO" is selected, it means that the wafer alignment mark image of the second wafer is defective.

[Step 190]

When the matching value is smaller than the minimum value in the step 180, i.e. the wafer alignment mark having defects, the wafer alignment mark image is replaced with the reference image, and then the step 150 is performed again. The wafer alignment mark image is replaced with the reference image while a coordinate data of the alignment mark is maintained.

In addition, a procedure for replacing a defective wafer alignment mark image with a reference image according to the present invention will be described in detail with reference to FIG. 3 in the corresponding section.

When the step 150 is performed again after the step 180 or 190, m is increased by 1, and then the step 160 is performed again. The step 150 is recursively performed either via the steps 170 and 180 or the steps 170, 180, and 190.

When m is increased to be greater than X after the step 150, then the step 200 is performed.

[Step 200]

The overlay accuracy for the underlying layer is measured using a wafer alignment sensor with X wafer alignment marks including the replaced wafer alignment marks in the step 190 to obtain the alignment information for the underlying layer.

[Step 210]

An exposure process is preformed.

Figure 2A:
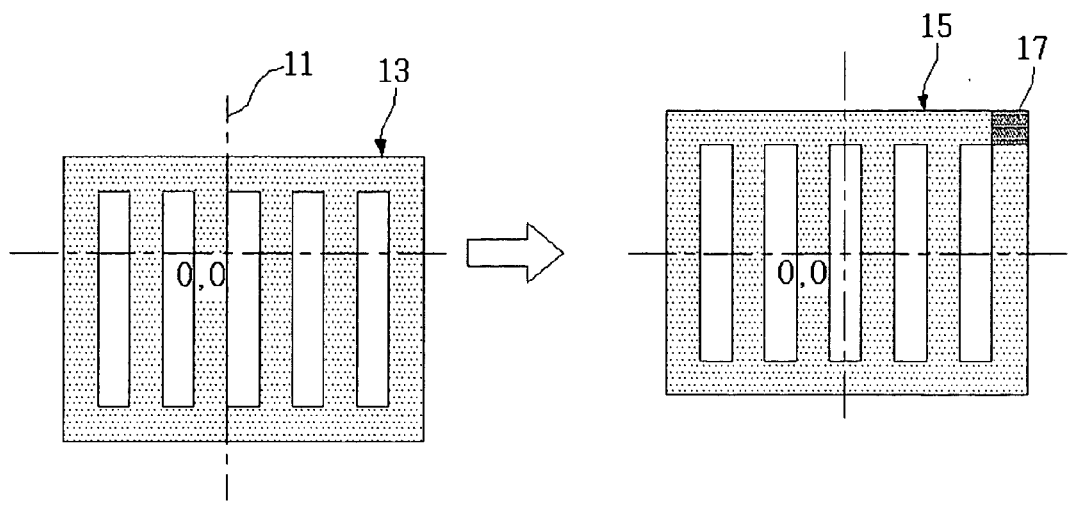
FIG. 2 is a top-view illustrating a method for calculating a matching value of FIG. 1.
Figure 2B:
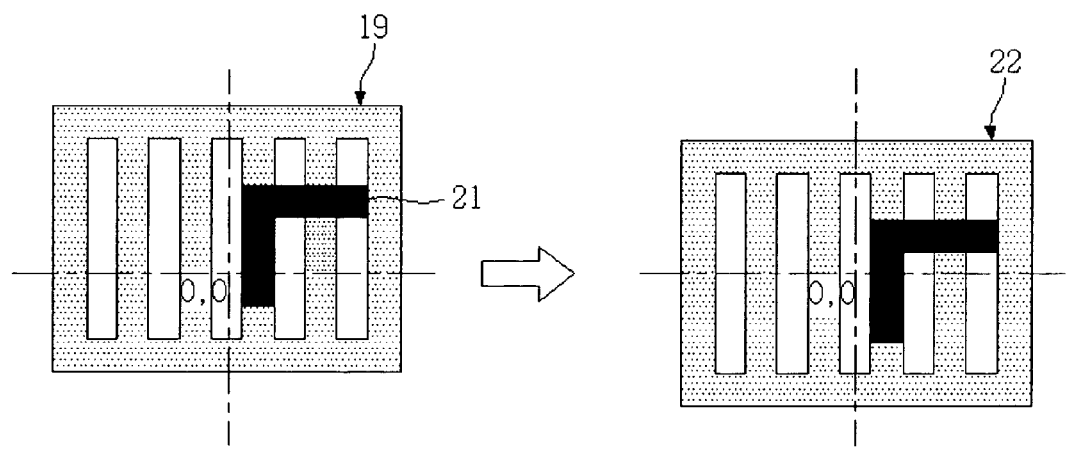
Figure 2C:
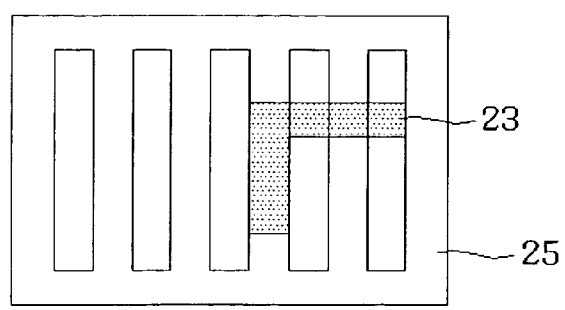

FIGS. 2a through 2c are top-views illustrating the method for calculating matching value in the steps 170 and 180 of the FIG. 1 in accordance with an embodiment of the present invention.

Referring to FIG. 2a, n wafer alignment marks are selected at the steps 110 and 120 of FIG. 1, and a non-defective first alignment mark 13 is then selected.

At this point, the first alignment mark 13 has a center spaced apart from a reference line 11 by a known distance, wherein the reference line 11 refers to the position of the first alignment mark 13. The reference line 11 is set in the exposure apparatus, and the center thereof is coordinated at (0,0).

Thereafter, the first alignment mark 13 is converted to a first alignment mark image having 256 levels per pixel, i.e. 8 bit gray level image. The first alignment mark image is then shifted to coordinate (0,0) in a job file so as to form the center-shifted reference image 15.

Here, since pattern size of a wafer alignment mark is substantially large, it is preferably that one pixel 17 of the center-shifted reference image 15 corresponds to an area on the first alignment mark 13 having a size larger than 0.62 μm$^2$, so that throughput is not affected.

Referring to FIG. 2b, an arbitrary wafer alignment mark as a second alignment mark 19 is selected among the wafer alignment marks of the second wafer loaded at the step 130.

Thereafter, the second alignment mark 19 is converted into second alignment mark image 22 having 8 bit gray data level. The second alignment mark image 22 is shifted to coordinate (0, 0) where the reference image 15 is stored.

Referring to FIG. 2c, the gray level value of the second alignment image 22 of the second alignment mark 19 is compared with the corresponding gray level value of the wafer alignment image 21 of the reference image 15 pixel by pixel to divide into first gray level pixels 23 and second gray level pixels 25. The second gray level pixels 25 have a value of zero when a gray level value of the pixel of the second alignment mark image 22 is subtracted from a gray level value of the pixel of the reference image 15. On the other hand, the first gray level pixels 23 have a non-zero value.

The matching value corresponds to a ratio of the number of the second gray level pixels 25 to that of the entire pixels.

For example, when the number of the second gray level pixels 25 is 700 and that of the first gray level pixels 23 is 300, the matching value is:

$$\frac{700}{700+300} \times 100\% = 70\%$$

$$70\% \times 10 = 700$$

Figure 3:
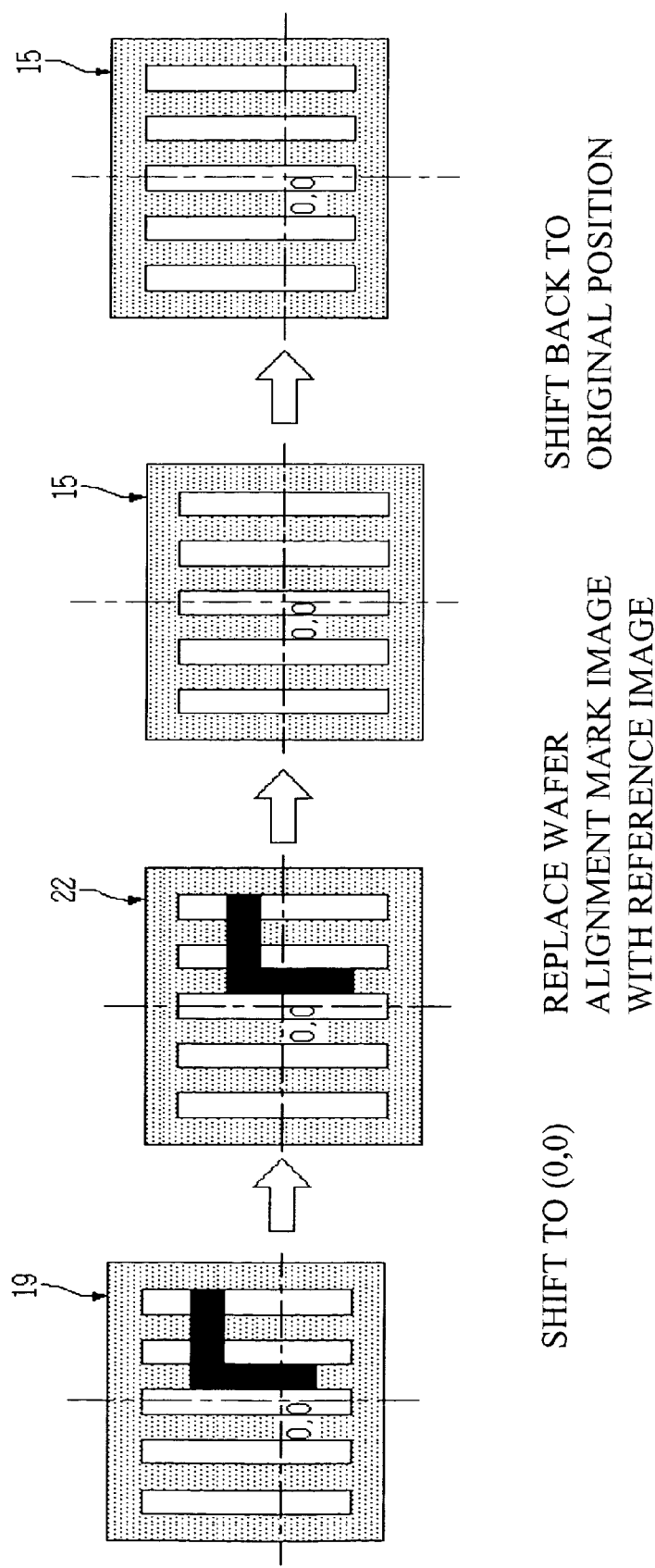
FIG. 3 is a top-view illustrating replacing wafer alignment mark image with a reference image and obtaining an alignment information for an underlying layer using a wafer alignment sensor.

FIG. 3 is a top-view illustrating method for replacing the wafer alignment mark images with the reference image in the order of the steps 170, 180, 190, 150, 160 and 200 in FIG. 1 and obtaining an alignment information for the underlying wafer.

First, the defective second alignment mark image 22 of the second alignment mark 19 of the second wafer loaded at the step 130 having 8 bit gray data level is shifted to coordinate (0, 0) in the job file of the exposure apparatus.

Next, the second alignment mark image 22 is replaced with the reference image 15, and it is shifted back to the location of the second alignment mark 19.

In the step 200 the overlay accuracy is measured as the subsequent process.

As described above, in accordance with the method for aligning wafer of in the present invention, a non-defective wafer alignment mark image which is used as a reference image is compared to wafer alignment mark images and defective wafer alignment mark images are replaced with the reference image to obtain alignment information of an underlying layer. This allows a wafer alignment by image processing and improves the overlay accuracy for an underlying layer.

As the present invention may be embodied in several forms without departing from the spirit or scope thereof, it should also be understood that the above-described embodiments are not limited by any of the details of the foregoing description. Rather the present invention should be construed broadly as defined in the appended claims. All changes and modifications that fall within the metes and bounds of the claims, or equivalences of such metes and bounds are intended to be embraced by the appended claims.

What is claimed is:

1. A method for aligning wafer, comprising the steps of:
   (a) loading and aligning a first wafer in an exposure apparatus;
   (b) selecting a non-defective wafer alignment mark among a plurality of wafer alignment marks of the first wafer and storing non-defective wafer alignment marks as a gray level reference image in a job file;

(c) loading a second wafer and storing a plurality of wafer alignment marks of the second wafer as a plurality of gray level wafer alignment mark images;
(d) respectively comparing each of the plurality of wafer alignment mark images of the second wafer with the reference image of the first wafer pixel by pixel to obtain matching value for each of the plurality of the wafer alignment mark images;
(e) comparing each of the plurality of the matching values with a minimum value set in the exposure apparatus;
(f) replacing the wafer alignment mark image having the matching value smaller than the minimum value with the reference image; and
(g) obtaining an alignment information for an underlying layer using a wafer alignment sensor.

2. The method according to claim 1, wherein the first wafer is a sample wafer and the second wafer is an actual wafer.

3. The method according to claim 1, wherein the reference image of the step (b) is shifted to coordinate (0,0) in the job file to be stored.

4. The method according to claim 1, wherein the pixel at the step (d) corresponds to an area on the second wafer having a size larger than 0.62 $\mu m^2$.

5. The method according to claim 1, wherein the gray level reference image and the gray level wafer alignment mark images have 8 bit gray data level respectively.

6. The method according to claim 1, wherein the step of (d) comprises subtracting a gray level value of the pixel of the wafer alignment mark image from a gray level value of the pixel of the reference image to obtain a value, and obtaining the matching value by calculating a ratio of pixels having the value of zero to the number of entire pixels.

* * * * *